United States Patent [19]

Tokiguchi et al.

[11] Patent Number: 5,086,256
[45] Date of Patent: Feb. 4, 1992

[54] EXTERNAL RESONANCE CIRCUIT TYPE RADIO FREQUENCY QUADRUPOLE ACCELERATOR

[75] Inventors: Katsumi Tokiguchi, Hitachi; Kensuke Amemiya, Katsuta; Noriyuki Sakudo; Takayoshi Seki, both of Hitachi, all of Japan

[73] Assignee: The Agency of Industrial Science and Technology, Tokyo, Japan

[21] Appl. No.: 438,018

[22] Filed: Nov. 20, 1989

[30] Foreign Application Priority Data

Nov. 24, 1988 [JP] Japan .................. 63-294775

[51] Int. Cl.⁵ .................................. H01J 25/10
[52] U.S. Cl. ....................... 315/111.81; 315/111.21; 250/423 R; 204/192.11; 204/192.37; 204/298.02; 204/298.04
[58] Field of Search ............ 315/111.81, 111.21; 250/423 R, 492.2; 204/192.37, 192.11, 298.02, 298.04, 298.41

[56] References Cited

U.S. PATENT DOCUMENTS

| | | | |
|---|---|---|---|
| 3,665,245 | 5/1972 | Schwarz | 315/111.91 |
| 3,793,063 | 2/1974 | Wiley | 250/293 X |
| 4,108,751 | 8/1978 | King | 204/192.11 |
| 4,135,094 | 1/1979 | Hull | 250/423 R X |
| 4,234,791 | 11/1980 | Enke et al. | 250/423 R X |
| 4,266,127 | 5/1981 | Change | 250/423 R X |
| 4,330,384 | 5/1982 | Okudaira et al. | 204/192.37 |
| 4,494,040 | 1/1985 | Moretti | 315/5.41 |
| 4,755,670 | 7/1988 | Syka et al. | 250/292 |
| 4,792,687 | 12/1988 | Mobley | 250/423 R |
| 4,801,847 | 1/1989 | Sakudo et al. | 315/5.41 |
| 4,843,034 | 6/1989 | Herndon et al. | 250/492.2 X |
| 4,867,939 | 9/1989 | Deutch | 376/156 |
| 4,937,206 | 6/1990 | Jaffe et al. | 250/423 R X |

FOREIGN PATENT DOCUMENTS

60-115199  6/1985  Japan .
60-121656  6/1985  Japan .

Primary Examiner—Eugene R. LaRoche
Assistant Examiner—Do Hyun Yoo
Attorney, Agent, or Firm—Antonelli, Terry, Stout & Kraus

[57] ABSTRACT

An Mev ion implantation apparatus which does not contaminate a sample substrate with heavy metal particles. The apparatus includes an external resonance circuit type RFQ accelerator incluidng undulated quadrupole electrodes and a separate radio frequency resonance circuit for generating a radio frequency high voltage to be supplied to the electrodes. The undulated quadrupole electrodes and at least a part of metallic supports for supporting the electrodes and voltage supplying lines are provided with a surface coating of silicon, silicon doped with an impurity such as boron, phosphorus, or arsenic, or a light element having a mass number of 28 or less, such as carbon.

8 Claims, 3 Drawing Sheets

EXTERNAL RESONANCE CIRCUIT TYPE RADIO FREQUENCY QUADRUPOLE ACCELERATOR

BACKGROUND OF THE INVENTION

1. Field of the Invention

The present invention relates to an Mev ion implantation apparatus provided with an external resonance circuit type RFQ (radio frequency quadrupole) accelerator and, more particularly, to an RFQ accelerator enabled to decrease contamination of the substrate by heavy metallic particles when implanting ions into a substrate.

2. Description of the Prior Art

FIG. 2(A) shows a prior art example of an arrangement of an Mev ion implantation apparatus having an RFQ accelerator. An ion beam emitted from an ion source 1 is accelerated by an RFQ accelerator 2 up to an energy on the order of Mev, and thereby, ion implantation into a sample substrate 5 is performed. FIG. 2(B) is a drawing for describing a detailed arrangement of the RFQ accelerator 2. The RFQ accelerator has four electrodes 2a-2d shaped in an undulated form within its RFQ container 2e. Radio frequency power in the range from tens to hundreds of MHz is introduced into the cylindrical container 2e so that a radio frequency high voltage is induced at the undulated quadrupole electrodes 2a-2d, and the ion beam is accelerated by the thus generated radio frequency field.

The ion beam is accelerated when it moves along the center axis of the space surrounded by the quadrupole electrodes 2a-2d. As an example similar to the prior art example of FIG. 2(B), one disclosed in Japanese Laid-open Patent Publication No. 60-121656 may be mentioned.

In the prior art example, of various ion species emitted from the ion source, a specific ion species only is accelerated to be implanted into the sample substrate 5 and other ion species are generally diverged during their acceleration within the undulated quadrupole electrodes to collide with the electrodes. Hence, the electrode material (copper in general) is sputtered by the ion beam and particles of such heavy metal are deposited onto the sample substrate 5 to contaminate it. When the sample substrate 5 is made from a semiconductor material, in particular, the contamination by heavy metal has frequently caused fatal defects in the semiconductor characteristics leading to fabrication of inferior products.

Meanwhile, in the prior art example as shown in FIG. 2(B), it has been impossible to use other material than copper or analogous materials as the material for undulated quadrupole electrodes. This is because, when radio frequency power is introduced into the cylindrical container 2 made from other material than copper, its electric resistance becomes high and heat loss becomes great, thereby making it difficult to generate a radio frequency high voltage within the cylindrical container. In fact, it is known that the generated voltage is inversely proportional to the square root of the electric resistance r.

The prior art RFQ accelerator shown in FIG. 2(B) has a basic problem other than the problem of the contamination by heavy metal. That is, since the cylindrical container 2e in the prior art RFQ accelerator was formed so as to have a specific size constituting the so-called cavity resonator, the operating radio frequency was limited to a specific frequency, and therefore, when the ion species is determined, the accelerating energy is determined and, hence, there has been a problem that there is only one choice of accelerating energy. In order to have accelerating energy of variable values, it is required to have the exciting frequency made changeable at will. A prior art example whereby this purpose is attained is shown in FIG. 3 (refer to Japanese Laid-open Patent Publication No. 60-115199). Referring to the figure, undulated quadrupole electrodes 2a-2d are contained in the container 2e. This container, however, is a mere container and does not have a specific size to constitute a cavity resonator. A radio frequency high voltage supplied to the electrodes 2a-2d is generated in an electric resonance circuit formed of an inductor 9 and a variable capacitor 10. The electric resonance circuit is excited by an oscillator 6 through an amplifier 7 and a coupling coil 8. Variable frequency is obtained by changing the value of the capacitance C or inductance L, thereby changing the resonance frequency. That is, the electrodes 2a-2d are only supplied with the voltage. Therefore, the portion for which materials with low electric resistance should be used to facilitate generation of the radio frequency high voltage is limited only to the external electric resonance circuit formed of the inductance L, capacitance C, and so on. That is, different from the prior art example of FIG. 2(B), the radio frequency current in the resonance circuit does not flow into the undulated quadrupole electrodes. In FIG. 3, generation of the radio frequency high voltage can be sufficiently achieved by forming the variable capacitor 10, inductance coil 9, and wirings from such materials as copper or that coated with silver. Therefore, it is not required to fabricate the undulated quadrupole electrodes 2a-2d from a metal of particularly low electric resistance, but it may be made from materials not causing the contamination by heavy metal on the sample substrate 5.

In the case of the prior art example of FIG. 2(B), since it adopted the cavity resonator structure, it was essentially necessary to use low electric resistance material such as copper and silver for fabricating the undulated quadrupole electrodes 2a-2d, but such electrical restriction on the material of the quadrupole electrodes 2a-2d was first removed by the prior art example of FIG. 3. However, in connection with the prior art example of FIG. 3, there have not been made any considerations and devices, with a view to prevent the implanted sample substrate from being contaminated by heavy metal particles, as to selection of the electrode material and methods to prevent the contamination by heavy metal particles.

SUMMARY OF THE INVENTION

A primary object of the present invention is to provide an ion implantation apparatus applying the prior art as shown in FIG. 3 to an Mev ion implantation apparatus which does not cause the contamination by heavy metal particles on an implanted sample substrate.

To achieve ion implantation into a substrate to be implanted without causing it to be contaminated by heavy metal particles by the use of an Mev ion implantation apparatus employing undulated quadrupole electrodes for accelerating the ion beam, it is well to adopt an external resonance circuit type RFQ accelerator and, in addition, to coat the surfaces of the quadrupole electrodes with the same material as the substrate to be implanted or material of a light element. Then, even if the ion beam collides with the electrodes and the electrode material is sputtered, the sputtered particles are the same as the sample substrate, and therefore, such a thing does not occur that the substrate changes its characteristics or it, as a semiconductor device, suffers an adverse effect to its electric characteristics. Further, since the accelerated beam can collide with other portions than the quadrupole electrodes, a greater effect can be obtained by providing similar surface coating on the electrode supports and the interior wall of the container.

Generally, the undulated quadrupole electrodes 2a-d have complicated shapes and their surfaces are required to be smooth to prevent dielectric breakdown from occurring between the electrodes upon application of the high voltage. While the so-called NC (numerical control) processing is used for obtaining such complex electrode forms, materials capable of being processed are limited to prevent occurrence of the warp or bending while the electrodes are processed and, hence, copper, aluminum, steel, etc. are normally used. Because of the complexity in the undulated form, the required smoothness of the surface, and the limit of usable materials as described above, it is difficult in general to line the surface of the electrode mechanically with a sheet member of a different material using screws or the like. Hence, such a method as plating or CVD (chemical vapor deposition), or physical surface coating with the use of an ion beam is effective to cover the surface of the undulated electrodes with a different substance. When quadrupole electrodes provided with surface coating through such a method is used, the contamination by heavy metal of the sample substrate can be greatly reduced even if the electrode surface is sputtered by the ion beam impinging thereon while the beam is accelerated. Further, since the coating formed as described above smoothens the finished surface, the dielectric breakdown between electrodes becomes difficult to occur and a stabilized beam accelerating operation can be realized.

BRIEF DESCRIPTION OF THE DRAWINGS

FIGS. 1(A)-1(B) shows an embodiment of the present invention, of which FIG. 1(A) is an explanatory drawing of the structure of a quadrupole electrode according to the present invention and FIG. 1(B) is an explanatory drawing of an Mev ion implantation apparatus provided with an external resonance circuit type RFQ accelerator;

DETAILED DESCRIPTION OF THE PREFERRED EMBODIMENTS

Figure 1A:
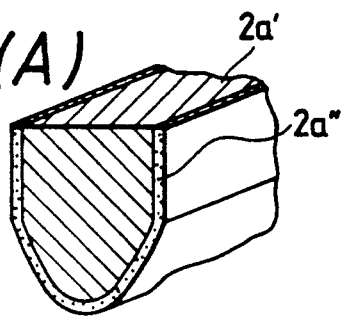

An embodiment of the present invention will be described below with reference to FIG. 1(A)-1(B). FIG. 1(A) shows an undulated electrode 2a' (whose material is copper) processed as in the past and uniformly coated with a silicon film 2a'' to a thickness of several μm-several 100 μm. The coating is performed by plasma deposition under vacuum. As the plasma discharge gas for the deposition, $SiH_4$ is used. A minus bias voltage is applied to the undulated copper electrodes whereby ions in the plasma are adapted to obtain energy to impinge on the electrodes while the silicon film is being formed. Thus, the adhesive strength of the formed film is greatly enhanced.

Figure 1B:
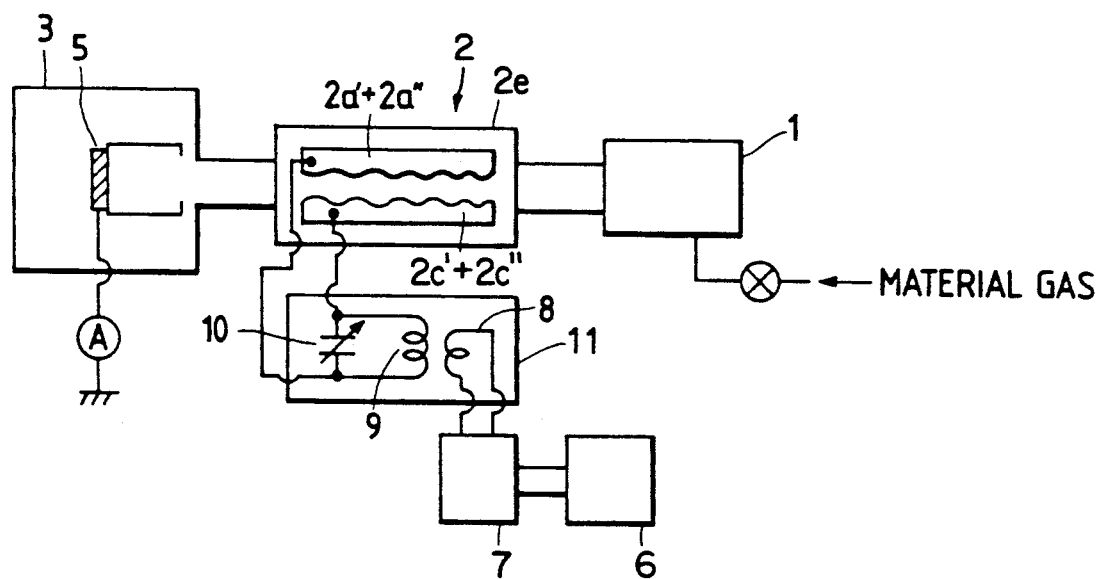
Figure 2A:
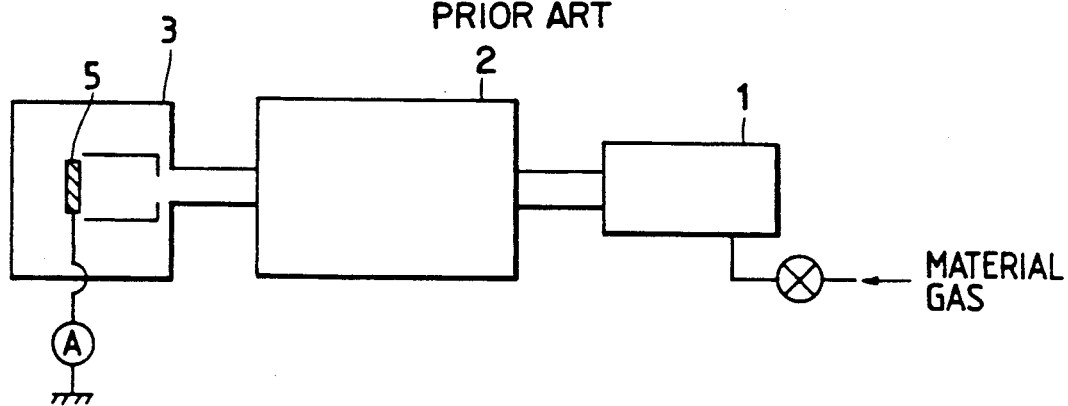
FIGS. 2(A)-2(B) show explanatory drawings of an ion implantation apparatus provided with a prior art RFQ accelerator.
Figure 2B:
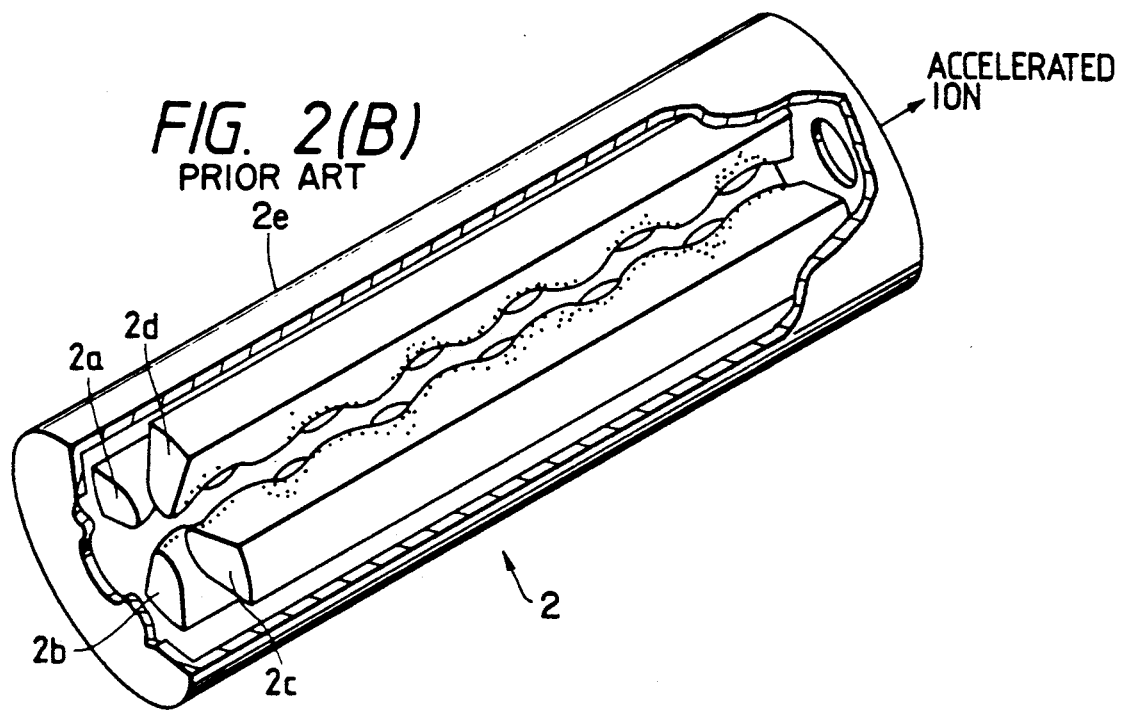
Figure 3:
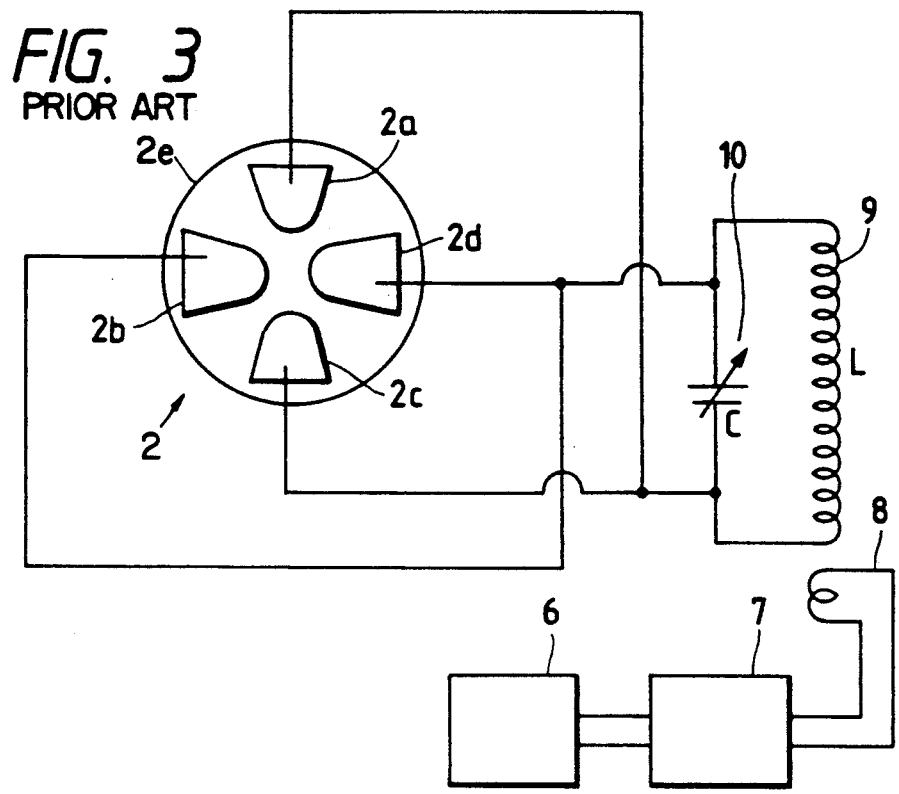
FIG. 3 is an explanatory drawing of a prior art external resonance circuit type RFQ accelerator.

FIG. 1(B) shows an embodiment in which an RFQ accelerator is constructed of the undulated quadrupole electrodes, surfaces of which are coated with the silicon film as described above, and incorporated into an Mev ion implantation apparatus. As the ion source 1, a microwave discharge type ion source was used. A boron ion (B+) beam drawn out of the source was accelerated to the level of Mev and implanted into a silicon wafer sample substrate 5 by a radio frequency high voltage supplied to the quadrupole electrodes from an external radio frequency resonance circuit formed of an inductor 9 and a variable capacitor 10. The resonance circuit is excited by an oscillator 6 through an amplifier 7 and a coupling coil 8. Coupling coil 8, inductor 9, and variable capacitor 10 are disposed in a container 11. The wafers 5 after the implantation were subjected to spectrum analysis of heavy metal ions in a secondary ion mass spectrometer (SIMS) and an Auger electron spectroscopic analyzer. Thereby, the contamination is compared between the cases where electrodes without silicon coating were used and where the electrodes of the present invention were used. When the prior art undulated quadrupole electrodes 2a-2d without the surface coating were used, particles of heavy metal originated from the electrode material (copper in the case of the experiment) were detected in the region from the surface down to a depth of several μm in as high a concentration as over 1 ppm (corresponding to $10^{16}$ particles/cm$^3$). In obtaining a B+ beam, $BF_3$ gas is generally used as the material gas supplied to the ion source. Therefore, other than B+, various ion species such as F+, BF+, and $BF_2$+ ions are simultaneously extracted from the ion source 1. In the RFQ accelerator, while the B+ ion is accelerated to be implanted into the wafer 5, other ions are diverged and some of them bombard the quadrupole electrodes. Since large amounts of other ions than the B+ ion are generated when the $BF_3$ gas is used, the contamination by heavy metal particles caused on the sample substrate was at such a high concentration level that it is sufficiently detected.

On the other hand, when ion implantation was carried out by accelerating the B+beam up to the Mev level by the use of the quadrupole electrodes coated with the silicon film 2a'' of FIG. 1(A), it was found that the contamination by heavy metal was of a level far below 1 ppm. Further, when the supports (made from a metal) supporting the quadrupole electrodes and the inner surface of the container 2e were also coated with a silicon film, the quantity of heavy metal particles originated from the electrode material, cylinder, and the like was decreased to the level barely detectable with the SIMS analyzer at the maximum sensitivity of the detector (corresponding to $10^{14}$ particles/cm$^3$). When a similar silicon coating is also applied to the surfaces of the piping between the cylinder 2 and the implantation chamber 3 and various internal components, the heavy metal particles were decreased so much that they became unable to be detected by the detector even at the detection level of the maximum sensitivity.

When an Mev implantation of the B+ion into a silicon substrate was carried out according to the present invention, deterioration in the electrical characteristics and occurrence of inferior products due to contamination by heavy metal particles was sharply decreased.

It is known that contamination by such particles as carbon (C) does not affect and deteriorate semiconductor characteristics as much as contamination by heavy metal particles such as copper and iron does. Hence, we prepared quadrupole electrodes coated conducted experiments with them. Also in this case, it with carbon instead of silicon as another embodiment and was found that deteriorated products by contamination by heavy metal particles were not produced. Thus, the object of the present invention can also be achieved by coating the quadrupole electrodes with a light element having a mass number of 28 or less, such as carbon, rather than with silicon, which has a mass number of 28.

Figure 4:
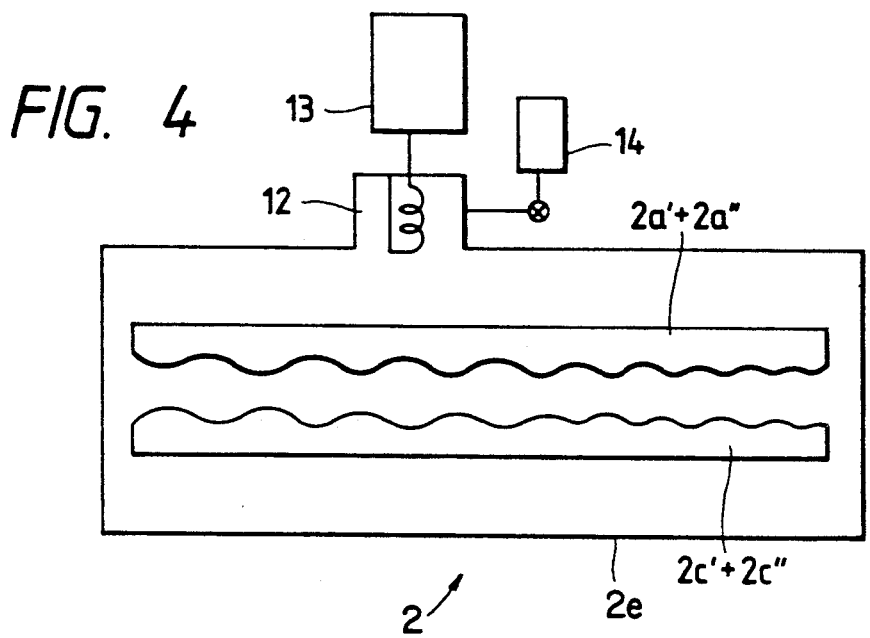
FIG. 4 is an explanatory drawing of another embodiment according to the present invention.

FIG. 4 is an explanatory drawing of another embodiment according to the present invention. When an external resonance circuit type RFQ accelerator according to the present invention (an accelerator incorporating undulated quadrupole electrodes overlaid with surface coating with an external resonance circuit added thereto) was operated for a long time, a problem was encountered that the coating film subjected to the sputtering beam became gradually thinner and the base metal came to the surface. The invention shown in FIG. 4 is that to provide an RFQ apparatus incorporating a plasma generating device whereby the coating film can be applied again to solve the above described problem. More particularly, this embodiment incorporates a separate radio frequency power source 13 (using 13.56 MHz) for generating plasma and radio frequency power is adapted to be supplied therefrom to a discharge coil 12. A discharge gas supply system 14 is used to introduce SiH$_4$ gas into the container 2e wherein plasma is generated, and thereby, a silicon film (up to a thickness of 100 μm) is deposited on the quadrupole electrodes 2a', 2c'. Thus, it becomes possible to operate the apparatus again without replacing the quadrupole electrodes and it has become unnecessary to stop the operation of the accelerator on account of its coating film coming to the end of its life. While the film is deposited, the acceleration of the beam is stopped.

Although a silicon film has been considered as the material for the surface coating in the above described embodiment, it is apparent from the purpose and structure of the present invention that a silicon film doped with a small amount of boron, an impurity such as phosphorus, or arsenic will also be applicable. In actual examples, SiH$_4$ gas with a small amount of BF$_3$, PH$_3$, or AsH$_3$ mixed therein was used and the above described silicon film doped with boron phosphorus, or arsenic was obtained. Although the case where a surface coating was applied to the quadrupole electrodes made from copper or steel has been described in the foregoing description of the present invention, it is, apparently, well even if the electrodes themselves are formed of silicon or silicon doped with an impurity such as boron, phosphorus, or arsenic.

According to the present invention, by constructing a high energy ion implantation apparatus of an Mev class using an external resonance circuit type RFQ accelerator, ion implantation causing small heavy metal contamination on a sample substrate can be embodied and great effects can be obtained therefrom when it is put into practical use.

What is claimed is:

1. In an external resonance circuit type RFQ accelerator comprising undulated quadrupole electrodes and a separate radio frequency resonance circuit for generating a radio frequency high voltage to be supplied to said electrodes, the improvement wherein said undulated quadrupole electrodes and at least a part of metallic supports for supporting said electrodes and voltage supplying lines are provided with a surface coating of silicon or silicon doped with boron, phosphorus, or arsenic.

2. In an external resonance circuit type RFQ accelerator comprising undulated quadrupole electrodes and a separate radio frequency resonance circuit for generating a radio frequency high voltage to be supplied to said electrodes, the improvement wherein said undulated quadrupole electrodes and at least a part of metallic supports for supporting said electrodes and voltage supplying lines are provided with a surface coating of a light element having a mass number of 28 or less.

3. An external resonance circuit type RFQ accelerator comprising undulated quadrupole electrodes and a radio frequency resonance circuit for generating a radio frequency high voltage to be supplied to said electrodes, said quadrupole electrodes and said radio frequency circuit being contained in separate containers, the container containing said quadrupole electrodes being evacuated, wherein at least part of an internal surface of the evacuated container containing said quadrupole electrodes is provided with a surface coating of silicon, silicon doped with an impurity, or a light element having a mass number of 28 or less.

4. An ion implantation apparatus comprising an external resonance circuit type RFQ accelerator according to claim 1, 2, or 3 and an implantation chamber for implanting ions accelerated by said RFQ accelerator into a silicon semiconductor substrate.

5. An external resonance circuit type RFQ accelerator according to claim 1, further comprising a vacuum container for containing said quadrupole electrodes, and plasma coating deposition means connected to said vacuum container for providing said surface coating.

6. An external resonance circuit type RFQ accelerator according to claim 2 or 3, wherein said light element having a mass number of 28 or less is carbon.

7. In an external resonance circuit type RFQ accelerator comprising undulated quadrupole electrodes and a separate radio frequency resonance circuit for generating a radio frequency high voltage to be supplied to said electrodes, the improvement wherein said quadrupole electrodes are formed from silicon or silicon doped with an impurity.

8. An external resonance circuit type RFQ accelerator according to claim 3 or 5, wherein said impurity is boron, phosphorus, or arsenic.

* * * * *